(12) United States Patent
Nevitt et al.

(10) Patent No.: US 10,037,850 B2
(45) Date of Patent: Jul. 31, 2018

(54) MULTILAYER FILM CAPACITOR

(71) Applicant: 3M INNOVATIVE PROPERTIES COMPANY, St. Paul, MN (US)

(72) Inventors: Timothy J. Nevitt, Red Wing, MN (US); Onur S. Yordem, St. Paul, MN (US); David T. Yust, Woodbury, MN (US); Charles D. Hoyle, Stillwater, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 355 days.

(21) Appl. No.: 14/574,780

(22) Filed: Dec. 18, 2014

(65) Prior Publication Data

US 2016/0181018 A1 Jun. 23, 2016

(51) Int. Cl.
*H01G 4/30* (2006.01)
*B29C 37/00* (2006.01)
(Continued)

(52) U.S. Cl.
CPC ............ *H01G 4/30* (2013.01); *B29C 37/0025* (2013.01); *B29C 47/065* (2013.01); *B29C 47/56* (2013.01); *B32B 3/08* (2013.01); *B32B 7/02* (2013.01); *B32B 27/00* (2013.01); *B32B 27/08* (2013.01); *B32B 27/28* (2013.01); *B32B 27/306* (2013.01); *B32B 27/308* (2013.01); *B32B 27/32* (2013.01); *B32B 27/34* (2013.01); *B32B 27/36* (2013.01); *H01G 4/005* (2013.01); *H01G 4/14* (2013.01); *H01G 4/228* (2013.01); *H01G 4/33* (2013.01);
(Continued)

(58) Field of Classification Search
CPC .. H01G 4/30; H01G 4/06; H01G 4/32; H01G 4/005; H01G 4/012; H01G 4/12; H01G 4/33; H01G 4/228
See application file for complete search history.

(56) References Cited

U.S. PATENT DOCUMENTS 3,689,810 A * 9/1972 Walles ................... H01G 4/008
252/500
5,073,814 A * 12/1991 Cole, Jr. ............. H01L 23/5222
257/643
(Continued)

FOREIGN PATENT DOCUMENTS

WO WO 2002-096647 12/2002
WO WO 2007-078916 7/2007

OTHER PUBLICATIONS

Chu, "Enhancement of dielectric energy density in the poly(vinylidene fluoride)-based terpolymer/copolymer blends", Applied Physics Letters, Jul. 2008, vol. 93, pp. 152903.1-152903.3.
(Continued)

*Primary Examiner* — Nguyen Ha
(74) *Attorney, Agent, or Firm* — Clifton F. Richardson

(57) ABSTRACT

A multilayer film capacitor having a composite stack disposed between two electrodes where the composite stack includes at least one thermoplastic conductive layer and at least one thermoplastic insulating layer. The total thickness of the conductive layers is at least 3 times the total thickness of the insulating layers. The conductive layers may include a thermoplastic polymer blended with conductive particles at a concentration higher than a percolation threshold.

23 Claims, 4 Drawing Sheets

(51) Int. Cl.

| | |
|---|---|
| *B29C 47/06* | (2006.01) |
| *H01G 4/005* | (2006.01) |
| *H01G 4/14* | (2006.01) |
| *H01G 4/228* | (2006.01) |
| *H01G 4/33* | (2006.01) |
| *H01L 21/8234* | (2006.01) |
| *B29C 47/56* | (2006.01) |
| *B32B 27/00* | (2006.01) |
| *B32B 7/02* | (2006.01) |
| *B32B 27/08* | (2006.01) |
| *B32B 27/28* | (2006.01) |
| *B32B 27/30* | (2006.01) |
| *B32B 27/32* | (2006.01) |
| *B32B 27/34* | (2006.01) |
| *B32B 27/36* | (2006.01) |
| *B32B 3/08* | (2006.01) |
| *B29K 23/00* | (2006.01) |
| *B29K 105/16* | (2006.01) |
| *B29K 507/04* | (2006.01) |
| *B29L 9/00* | (2006.01) |
| *B29L 31/34* | (2006.01) |

(52) U.S. Cl.
CPC ........... *H01L 21/823412* (2013.01); *H01L 21/823431* (2013.01); *H01L 21/823475* (2013.01); *H01L 21/823493* (2013.01); *B29K 2023/12* (2013.01); *B29K 2105/16* (2013.01); *B29K 2507/04* (2013.01); *B29K 2995/0005* (2013.01); *B29K 2995/0007* (2013.01); *B29L 2009/003* (2013.01); *B29L 2009/005* (2013.01); *B29L 2031/34* (2013.01); *B32B 2262/106* (2013.01); *B32B 2264/105* (2013.01); *B32B 2264/12* (2013.01); *B32B 2270/00* (2013.01); *B32B 2274/00* (2013.01); *B32B 2307/202* (2013.01); *B32B 2307/204* (2013.01); *B32B 2307/206* (2013.01); *B32B 2307/518* (2013.01); *B32B 2307/732* (2013.01); *B32B 2457/16* (2013.01)

(56) References Cited

U.S. PATENT DOCUMENTS

| | | | |
|---|---|---|---|
| 5,593,462 A | | 1/1997 | Gueguen |
| 5,609,554 A | * | 3/1997 | Hayashi ............. B29C 44/0461 492/53 |
| 6,767,492 B2 | | 7/2004 | Norquist |
| 6,916,440 B2 | | 7/2005 | Jackson |
| 7,911,029 B2 | | 3/2011 | Cui |
| 2002/0187401 A1 | | 12/2002 | Lee et al. |
| 2010/0033898 A1 | | 2/2010 | Zhong et al. |
| 2010/0172066 A1 | | 7/2010 | Baer |
| 2010/0309607 A1 | | 12/2010 | Liu et al. |
| 2011/0110015 A1 | * | 5/2011 | Zhang .................... H01G 4/20 361/311 |
| 2011/0228447 A1 | | 9/2011 | Gadkaree et al. |
| 2012/0120552 A1 | | 5/2012 | Ito et al. |
| 2016/0020026 A1 | * | 1/2016 | Lazarev ................ H01G 4/14 361/301.4 |

OTHER PUBLICATIONS

Krupka, "Split Post Dielectric Resonator Technique for Precise Measurements of Laminar Dielectric Specimens", 13$^{th}$ International Conference on Microwaves, Radar and Wireless Communications, 2000, vol. 1, pp. 305-308.

Li, "Easy Fabrication and Resistivity-Temperature Behavior of an Anisotropically Conductive Carbon Nanotube-Polymer Composite", Journal of Physical Chemistry B, 2010, vol. 114, No. 2, pp. 689-696.

Olbrich, "Innovative Solutions in Film Capacitor Vacuum Coating for advanced automotive Applications", CARTS Asia 2006, Oct. 9-13, 2006, 18 pages.

Wang, "Recent Development of High Energy Density Polymers for Dielectric Capacitors", IEEE Transactions on Dielectrics and Electrical Insulations, Aug. 2010, vol. 17, No. 4, pp. 1036-1042.

Zhang, "High temperature Polymer Capacitor Film with High Dielectric Constant", CARTS USA 2011 Proceedings, Mar. 28-31, 2011, pp. 421-428.

* cited by examiner

MULTILAYER FILM CAPACITOR

BACKGROUND

Capacitors can be made by attaching metal layers onto opposing surfaces of a dielectric material. The physical and geometric properties of the dielectric material determine the capacitance and other properties of the capacitor. In many applications, it is desired for a capacitor to have a high energy density and low dissipation. Capacitors using polymer film for the dielectric material have certain advantages over ceramic-based capacitors, such as improved high-temperature characteristics, low dissipation factors, and improved tolerance to mechanical stress. However, polymer film capacitors have typically not been able to achieve energy densities much higher than about 1 J/cc. Accordingly, a need exists for an improved polymer film capacitor.

SUMMARY

A capacitor consistent with the present description includes a composite stack disposed between first and second electrodes. The composite stack includes one or more thermoplastic conductive layers and one or more thermoplastic insulating layers disposed adjacent to the one or more thermoplastic conductive layers. The one or more thermoplastic conductive layers have a total thickness greater than 3 times the total thickness of the one or more thermoplastic insulating layers.

A capacitor consistent with the present description includes a composite stack disposed between first and second electrodes. The composite stack includes two or more thermoplastic conductive layers and two or more thermoplastic insulating layers interspersed with the two or more thermoplastic conductive layers. At least one of the two or more thermoplastic conductive layers includes a thermoplastic polymer blended with a plurality of conductive particles at a concentration higher than a percolation threshold.

Methods consistent with the present description include co-extrusion of materials to form at least portions of the capacitor.

DETAILED DESCRIPTION

Figure 1:
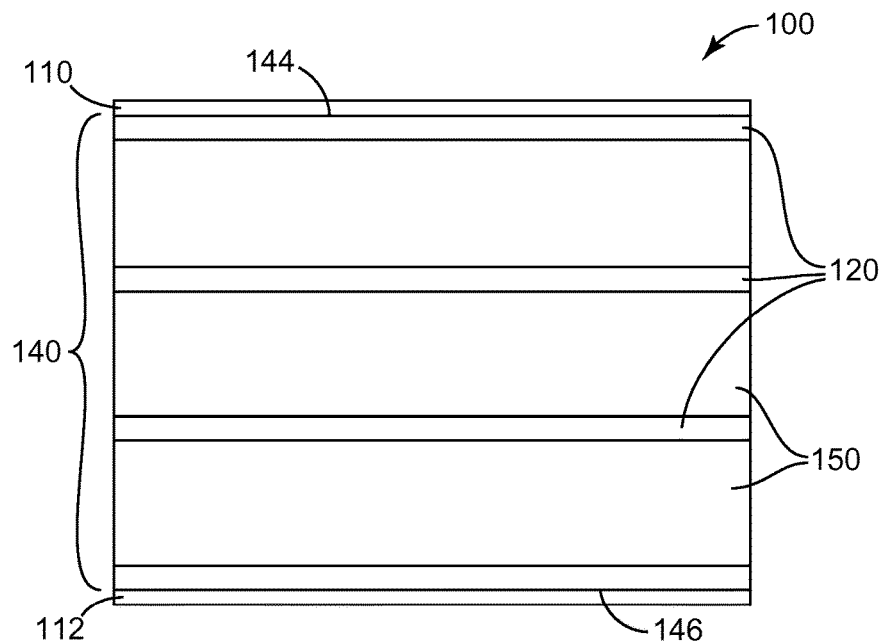
FIG. 1 is a schematic cross-sectional view of a capacitor.

In the following description, reference is made to the accompanying drawings that forms a part hereof and in which are shown by way of illustration. The drawings are not necessarily to scale. It is to be understood that other embodiments are contemplated and may be made without departing from the scope or spirit of the present disclosure. The following detailed description, therefore, is not to be taken in a limiting sense.

Embodiments of the present description include a capacitor having a composite stack containing at least two film layers where at least one of the layers is a thermoplastic insulating layer and at least one of the layers is a thermoplastic conducting layer. It has been found that desirable electrical properties of the capacitor can be achieved by a suitable selection of materials for the insulating and conductive layers and by suitable choice of layer thicknesses. Many of the desirable electrical properties of the capacitor can be described in terms of an effective dielectric function of the composite stack.

The effective dielectric function of a composite stack can be defined as $$\epsilon_{\mathit{eff}} = Cd/(\epsilon_0 A) \qquad \text{Equation (1)}$$

where C is the capacitance of the composite stack when placed between planar electrodes, A is a surface area of the composite stack between the planar electrodes, d is the thickness of the composite stack, and $\epsilon_0$ is the permittivity of free space. In a layered material, the normal component of the displacement field, which is the product of the electric field and the relative permittivity (i.e., the dielectric function), is continuous across the layers. This condition determines the voltage distribution across the capacitor for a given applied charge and this allows the capacitance, and hence the effective dielectric function, to be determined. The resulting effective dielectric function can be expressed as $$1/\epsilon_{\mathit{eff}} = (1/d)\Sigma d_i/\epsilon_i \qquad \text{Equation (2)}$$

where $d_i$ is the thickness of layer i, $d_i \Sigma d_i$ is the thickness of the stack, and $\epsilon_i$ is the dielectric function (relative permittivity) for layer i. The effective dielectric function for a multilayer stack is therefore determined by the layer thicknesses and the dielectric functions of the individual layers.

A composite stack having one or more conducting layers and one or more insulating layers can be described in terms of the total thickness of the conductive layers, $T_C$, and the total thickness of the insulating layers, $T_I$. It has been found that the dielectric properties of the composite stack can be adjusted by a suitable selection of the thickness ratio $T_C/T_I$. For example, it has been found that the low-frequency effective dielectric function generally increases with increasing $T_C/T_I$. In some embodiments, $T_C/T_I$ is greater than about 2, or greater than about 3, or greater than about 4, or greater than about 5, or greater than about 6, or greater than about 7, or greater than about 8 and may be less than about 100 or less than about 50.

In some embodiments, the conducting layer is a polymer or blend of polymers containing a plurality of conductive particles where the conductive particles are included at a concentration higher than the percolation threshold so that a conductive network is formed. The conductivity of such a conducting polymer composite can be adjusted by changing the concentration of the conducting particles and/or by the choice of the type of conducting particles used. As used herein, particles refer to any particulate filler and such particles can have the following shapes: spherical or aspherical, flakes, wires or whiskers, rod-shaped, or other shapes. Conductive particles may be carbon black, carbon fiber, acetylene black, dispersible graphenes, single- or multi-walled carbon nanotubes, metallic particles such as silver flakes or silver nanoparticles, or a combination thereof. In some embodiments, the conductive particles are nanoparticles having a least one dimension less than 1 micron and in some embodiments the conductive particles are nanoparticles having a least one dimension less than 100 nanometers. In some embodiments, the conductive particles have at least one dimension in the range of 10-500 nm or in the range of 10-100 nm. In some embodiments the conductivity of the conductive particles is greater than about 1 S/cm, or greater than about 10 S/cm, or greater than about 100 S/cm and may be less than about $10^6$ S/cm or less than about $10^5$ S/cm.

The dielectric properties of the composite conducting layer are dependent on the choice of polymer used in the layer as well as additives in the polymer. Additives to increase the dielectric function of the conducting layers and/or the nonconductive layers may be mixed, blended, compounded or otherwise combined with the polymeric material of the conductive and/or the nonconductive layers. Examples additives include $BaTiO_3$, lead zirconate titanate (PZT), PT (lead titanate) and PT composites, and combinations thereof; other examples include zirconia, exfoliated clays, and the like.

In many embodiments of the present description, the composite stack is a multilayer film stack containing thermoplastic conducting layers and thermoplastic insulating layers. As used herein, "thermoplastic" material refers to polymers or polymer composites having melt-flow characteristics such that the materials are capable of being melt-processed and extruded through a die or other extrusion component. Such materials may also be referred to as extrudable materials. The process conditions for extrusion or co-extrusion can depend upon the materials used for the conductive and insulating layers. Generally, extrusion conditions are chosen to adequately feed, melt, mix and pump the material streams in a continuous and stable manner. Final melt stream temperatures are chosen within a range which avoids freezing, crystallization or unduly high pressure drops at the low end of the temperature range and which avoids degradation at the high end of the temperature range.

Suitable materials for the thermoplastic insulating layers and/or for the thermoplastic conducting layers (provided conductive particles are added to make the layer conductive) include acrylonitrile butadiene styrene (ABS), acrylics, cellulosics, cyclic olefin copolymers (COC), olefin block copolymers such as those sold by Dow Chemical under the INFUSE trade name, ethylene vinyl acetate (EVA), ethylene vinyl alcohol (EVOH), polyamides, polyesters, polyethylene terephthalate (PET), polyethylene naphthalate (PEN), polyurethanes, polypropylene (PP), polyethylene (PE), low-density polyethylene (LDPE), polycarbonate (PC), polyether ether ketone (PEEK), polyethylenimine (PEI), polystyrene (PS), polyvinyl chloride (PVC), fluoropolymers, polytetrafluoroethylene (PTFE), polyvinylidene fluoride (PVDF), polysulfone, styrene acrylonitrile (SAN), silicone elastomers, acrylic elastomers, methacrylate copolymers, polyurethanes, polybutadienes, thermoplastic elastomers, polybutadiene-acrylonitrile copolymers, styrene based copolymers such as styrene ethylene butadiene styrene sold by KRATON Polymers under the KRATON trade name, and combinations thereof.

The effective dielectric function for the composite stack has a resonance frequency which can be defined as the frequency where the imaginary part of the effective dielectric function has a maximum value. An effective loss tangent for the composite stack is given by the ratio of the imaginary part of the effective dielectric function to the real part of the effective dielectric function. In has been found that the layer thicknesses and the conductivity and dielectric properties of the conducting layers can be chosen to give a high low-frequency effective dielectric function, a high resonance frequency and a low effective loss tangent. In some embodiments the real part of the effective dielectric function at a frequency of 60 Hz is greater than about 10, or greater than about 15, or greater than about 18, or greater than about 20, or greater than about 25 and may be less than about 200 or less than about 100. In some embodiments the composite stack has an effective dielectric function having a resonance at a frequency greater than about 60 Hz, or greater than about 1 kHz, or greater than about 100 kHz, or greater than about 1 MHz, or greater than about 10 MHz. In some embodiments the composite stack has an effective dielectric function having a resonance at a frequency less than about 100 GHz or less than about 10 GHz. In some embodiments the composite stack has an effective loss tangent less than about 0.02, less than about 0.01, less than about 0.005, or less than about 0.002, or less than about 0.001, or less than about 0.0005 at a frequency between 1 Hz and 10 MHz. In some embodiments the composite stack has an effective loss tangent in a range of 0.00005 to 0.005 at a frequency between 1 Hz and 10 MHz. In some embodiments the composite stack has an effective loss tangent less than about 0.005 or less than about 0.001 over a frequency range of about 1 Hz to about 10 MHz, or over a frequency range of about 10 Hz to about 1 MHz, or over a frequency range of about 60 Hz to about 100 kHz.

It has been found that the effective resonance frequency increases with increasing conductivity of the conducting layers. In embodiments where the conducting layers include conducting particles in a thermoplastic resin, the conductivity of the conducting layers can be adjusted by adjusting the concentration of the conductive particles and/or by the choice of conducting particles, as previously noted. Unless otherwise indicated, values specified for resistivity or conductivity refer to the real part of the resistivity or the real part of the conductivity measured at a frequency of 60 Hz. In some embodiments, the in-plane resistivity or conductivity (i.e., the resistivity or conductivity measured by applying an electric field in the plane of the layers) and the out-of-plane resistivity or conductivity (i.e., the resistivity or conductivity measured by applying an electric field perpendicular to the plane of the layers) are different, while in other embodiments the resistivity or conductivity values measured in-plane and out-of-plane are about the same. As used herein, a layer is conductive if both the in-plane and the out-of-plane resistivity are less than about $10^{10}$ Ohm-cm. In some embodiments, the conducting layers have an in-plane or an out-of-plane resistivity less than about $10^8$ Ohm-cm, less than about $10^5$ Ohm-cm, or less than about 100 Ohm-cm, or less than about 50 Ohm-cm, or less than about 25 Ohm-cm, or less than about 15 Ohm-cm, or less than about 10 Ohm-cm. In some embodiments, the conducting layers have an in-plane or an out-of-plane resistivity greater than about 0.01 Ohm-cm. In some embodiments, the conducting layers have an in-plane or an out-of-plane conductivity greater than about $10^{-6}$ S/m, or greater than about 0.0001 S/m, or greater than about 0.01 S/m, or greater than about 0.05 S/m, or greater than about 0.1 S/m, or greater than about 0.2 S/m, or greater than about 1 S/m, or greater than about 2 S/m, or greater than about 3 S/m. In some embodiments, the conducting layers may have an in-plane or an out-of-plane conductivity less than about $10^4$ S/m or less than about less than about $10^3$ S/m.

In some embodiments, a multilayer film suitable for use in a capacitor is made by co-extruding conductive and insulating layers to form a composite stack and then stretching the composite stack. In some embodiments, the composite stack is biaxially stretched, while in other embodiments, the composite stack is uniaxially stretched. Stretching reduces the thickness of the extruded layers thus allowing thin insulating layers to be produced. The dielectric breakdown strength is often higher for very thin insulating layers compared to thicker layers of the same material. In some embodiments, one or more of the insulating layers have a thickness in the range of about 50 nm to about 500 nm. In some embodiments, the composite stack has a thickness in the range of about 1 μm to about 10 μm. In some embodiments, the composite stack is stretched in a machine direction at a draw ratio between about 2 and about 10 and/or in a transverse direction at a draw ratio between about 2 and about 10. In some embodiments, the composite stack is biaxially stretched with the draw ratio approximately equal in the machine direction and in the transverse direction.

In embodiments where a conducting layer includes particles in a thermoplastic resin, an anisotropic conductivity (or resistivity) may result from stretching the layers. As described in the Examples, it has been found that stretching a film made by extruding polypropylene blended with carbon black results in a significantly lowered out-of-plane conductivity while the in-plane conductivity is similar to the conductivity of the unstretched film. Provided that the out-of-plane resistivity of the conductive layers remain sufficiently low after stretching (for example, less than about $10^{10}$ Ohm-cm), the resulting stretched composite stack will be useful as a dielectric stack in a capacitor.

Stretching the composite stack may provide improved dielectric breakdown strength, but it increases the probability that small defects in the insulating layers, which can grow when the film is stretched, will cause short circuits rendering a capacitor made using the composite stack ineffective. It has been found that co-extruding relatively thick conducting layers (for example, $T_c/T_I$ greater than about 3) along with the insulating layers can reduce or substantially eliminate such defects. In many embodiments, at least one thermoplastic insulating layer is substantially free of such defects. In many embodiments, all of the thermoplastic insulating layers are substantially free of such defects. A layer having such defects can be described as being discontinuous over some region or regions of the layer. In many embodiments, at least one thermoplastic insulating layer is substantially continuous. In some embodiments, all thermoplastic insulating layers are substantially continuous.

FIG. 1 shows a capacitor 100 with a first electrode 110, a second electrode 112 and a composite stack 140. The first electrode 110 is in contact with a first major surface 144 of the composite stack 140 and the second electrode 112 is in contact with a second major surface 146 of the composite stack 140. The composite stack 140 includes insulating layers 120 and conducting layers 150. Each of the insulating layers 120 and conducting layers 150 are made from thermoplastic compositions. One or more of the conducting layers 150 may be made from a thermoplastic polymer blended with a plurality of conductive particles at a concentration higher than the percolation threshold for the conductive particles in the thermoplastic polymer. The insulating layers 120 are disposed adjacent the conductive layers 150. The insulating layers 120 and the conductive layers 150 alternate with each pair of conductive layers separated by at least one insulating layer and each pair of insulating layers separated by at least one conductive layer. In some embodiments the composite stack has a single insulating layer and a single conducting layer, while in other embodiments there are a plurality of insulating layers and a plurality of conductive layers as shown in FIG. 1. In some embodiments, the composite stack 140 includes two or more thermoplastic conductive layers 150 and two or more thermoplastic insulating layers 120 interspersed with the two or more thermoplastic conductive layers 150. Layers of a first type may and a second type may be interspersed with one another by being placed at various positions within a stack such that the layers are intermingled with one another. For example, layers of a first type and layers of a second type may be interspersed by alternating the layers one after the other as shown in FIG. 1.

Figure 2:
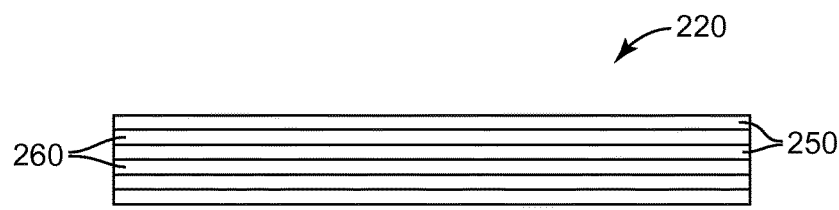
FIG. 2 is a schematic cross-sectional view of an insulating layer.

In some embodiments, the composite stack has at least one insulating layer that contains a plurality of insulating sublayers. In some embodiments, the plurality of insulating sublayers contains an alternating stack of a first insulating thermoplastic polymer and a second insulating thermoplastic polymer different from the first insulating thermoplastic polymer. FIG. 2 shows an insulating layer 220 having alternating layers of a first insulating sublayer 250 and a second insulating sublayer 260. In some embodiments, one or more of the insulating sublayers have a thickness in the range of about 5 nm to about 100 nm or in a range of about 10 nm to about 50 nm. In some embodiments the number of sublayers in an insulating layer is in the range of 2 to about 100, or 2 to about 30, or about 4 to about 15. Using a plurality of insulating sublayers can help delocalize charge build up in the layers and increase the dielectric breakdown strength.

In some embodiments, the composite stack has a dielectric breakdown strength of greater than about 500 V/μm, or greater than about 700 V/μm, or greater than about 800 V/μm, or greater than about 900 V/μm, or greater than about 1000 V/μm and in some embodiments, the composite stack may have a dielectric breakdown strength less than about $10^6$ V/m.

The maximum energy density in the composite stack is obtained when the maximum voltage (i.e., the dielectric breakdown strength) is applied across the composite stack. This energy density is proportional to the product of the effective dielectric function and the square of the dielectric breakdown strength. In some embodiments, the energy density when a low frequency (e.g., 0 Hz or 60 Hz) voltage having a magnitude just under the dielectric breakdown strength (for example, a voltage magnitude of 95% or 98% of the dielectric breakdown strength) is applied across the composite stack is greater than about 6 J/cc, or greater than about 8 J/cc, or greater than about 10 J/cc and may be less than about 200 J/cc or less than about 100 J/cc.

Referring again to FIG. 1, a capacitor 100 may be prepared from the composite stack 140 by applying a first electrode 110 to a first metal surface 144 and applying a second electrode 112 to a second major surface 146 opposite the first major surface 144. Electrodes 110 and 112 may be applied to the first and second major surfaces 144 and 146, respectively, by metalizing, depositing, forming or otherwise applying metal to the first and second major surfaces 144 and 146. Suitable processes for depositing metal layers to form electrodes 110 and 112 include vacuum deposition, sputtering and electroplating. Alternatively, the electrodes 110 and 112 may be applied to the composite stack 140 by applying a first metal foil to the first major surface 144 and a second metal foil to the second major surface 146. Suitable metal foils include aluminum foil. In some embodiments, a large-area roll-to-roll sputtering process is used to deposit the electrodes. In some embodiments, both major surfaces are simultaneously metalized while in other embodiments, the first major surface 144 is first metalized and then subsequently the second major surface 146 opposite the first major surface is metalized. The thickness of the metal layers may be in the range of about 20 nm to about 100 nm. The metallization may be done in a patterned form with small vias between large metal areas. In this case, the vias act as fuses allowing for self-healing of a particular capacitance region in the event of dielectric breakdown causing a short between the anode and the cathode on the opposite sides of the film.

Figure 3:
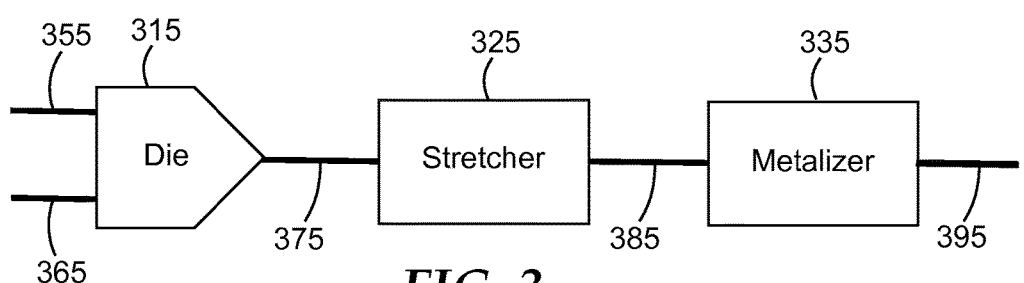
FIG. 3 is a diagram of a system for co-extruding and stretching layers in a composite stack.

A method of making a composite stack and a capacitor is schematically illustrated in FIG. 3 which shows a thermoplastic insulating material 355 and a thermoplastic conductive material 365 fed into an extrusion die 315 to form a pre-stretched composite stack 375 for making a capacitor. Suitable extrusion dies are described in U.S. Pat. No. 6,767,492 (Norquist et al.). The extruded pre-stretched composite stack 375 is fed into a stretching apparatus 325 which outputs the stretched composite stack 385. Suitable stretching apparatuses include tenter apparatuses, such as straight course tenters or parabolic tenters such as those described in U.S. Pat. No. 6,916,440 (Jackson et al.). The stretched composite stack 385 is input into a metallization apparatus 335 which applies electrodes to the stretched composite stack 385 and outputs capacitor 395. Suitable metallization apparatuses include coating systems such as those available from VON ARDENNE GmbH (Dresden, Germany) and large-area roll-to-roll deposition systems such as those available from ProtoFlex Corporation (Centennial, Colo.).

As used herein, layers, components, or elements are described as being adjacent one another. Layers, components, or elements can be adjacent one another by being in direct contact, by being connected through one or more other components, or by being held next to one another or attached to one another. Layers, components, or elements that are in direct contact are described as being immediately adjacent. For example, referring to FIG. 1, insulating layers 120 are adjacent to conducting layers 150 and first electrode 110 is immediately adjacent to composite stack 140.

EXAMPLES

Composite stacks suitable for use in capacitors were prepared and tested or were modeled. All parts, percentages, ratios, etc. in the examples and the rest of the specification are by weight, unless noted otherwise.

Dielectric Spectroscopy

Dielectric properties and electrical conductivity perpendicular to film plane measurements below 1 MHz were determined using an Alpha-A High Temperature Broadband Dielectric Spectrometer modular measurement system (available from Novocontrol Technologies, Aubaschstr, Germany). The system supports frequency domain measurements at discrete frequencies from 0.00001 Hz to 20 MHz and allows impedances from 10 milliOhms up to $10^{14}$ ohms to be measured up to a maximum of 4.2 volts AC. For these experiments, a variable AC voltage of up to 1000 volts peak to peak volts was used.

The sample cell BDS 1200 (available from Novocontrol Technologies, Aubaschstr, Germany) utilizing gold plated parallel plates of 40 mm diameter was interfaced to the Alpha-A mainframe while utilizing the ZG2 Dielectric/ Impedance General Purpose Interface (available from Novocontrol Technologies, Aubaschstr, Germany). Each sample was placed between parallel plate electrodes and the complex permittivity (dielectric function and loss) were evaluated from the phase sensitive measurement of the electrodes voltage difference ($V_S$) and current ($I_S$). Vapor coated gold electrodes were sputter coated onto the samples. This measurement system was designed and operated in accordance with the ASTM D150-11 test standard.

Measurements in the frequency range from 1 MHz-1 GHz were performed with an Impedance Material Analyzer system (Model type 4291) using the 16453A dielectric material test fixture (available from Agilent Technologies, Santa Clara, Calif.). The applicable dielectric material was a solid sheet that was smooth and had equal thickness from one end to the other. The structure of the 16453A contained an upper electrode that had an internal spring, which allowed the material under test to be fastened between the electrodes. Applied pressure was also adjustable. The 16453A was not equipped with a guard electrode. This is because a guard electrode at high frequency can cause greater residual impedance and poor frequency characteristics. To lessen the effect of edge capacitance, a correction function was used as described in ASTM D150-11. Also, residual impedance, which can be a major cause for measurement error, cannot be entirely removed by open and short compensation. Accordingly, TEFLON was utilized as a load compensation device.

The measurement of in-plane conductance was performed at frequency 9.3 GHz using a Split-Post Dielectric Resonator. Split-post dielectric resonator techniques for dielectric material characterization are known and are described, for example, in "Split Post Dielectric Resonator Technique for Precise Measurements of Laminar Dielectric Specimens", Krupka et al, 13$^{th}$ *International Conference on Microwaves, Radar and Wireless Communications*, Vol. 1, 2000, pp. 305-308, and references therein. In the split-resonator experiments, a sample of a film to be tested was inserted between two fixed dielectric resonators supported respectively by two posts. Employing the supporting posts in this way provided the advantage of reduced wall loss. The posts which supported the resonators were prepared from material chosen to have low dielectric constant and low loss for minimizing overall signal loss.

The resonance frequency and quality factor of the posts were influenced by the presence of the specimen. These changes in resonance frequency and quality factor were detected using conventional numerical techniques and converted into the values of the dielectric function and conductivity of the specimen.

The measurements were taken at a single frequency equal 9.3 GHz, with loop coupling employed. The resonator operated with the TE$_{01\delta}$ mode which has only an azimuthal electric field component so that the electric field remained continuous on the dielectric interfaces. This minimized air gap systematic uncertainties. The resonator measured the permittivity component in the plane of the specimen.

Extrudable Thermoplastic Conductors for Thin Stretched Stacks

Carbon black filled co-extrudable thermoplastics were prepared which demonstrate percolating semi-conductive behavior at DC up to the GHz frequency range. RTP 199X13007481EG—a blend of polypropylene and ~20-30 wt % carbon black (available from RTP Company, Winona, Minn. and denoted herein as "RTP PP w/CB") was pressed from received pellets using a Wabash Press hot and cold platen press (available from Wabash MPI, Wabash, Ind.) for 3 min preheat, 3 min hot pressed at 500° F. (260° C.), and 3 min cold press 5° C. to a final thickness of 250 μm.

A castweb control was prepared as follows: Poly(propylene-co-ethylene) 8650 (available from Total Petrochemicals and Refining USA, Inc., Houston, Tex. and denoted herein as "Neat PP") was pressed from received pellets using a Wabash Press hot and cold platen press (available from Wabash MPI, Wabash, Ind.) for 3 min preheat, 3 min hot pressed at 500° F. (260° C.), and 3 min cold press 5 min to a final thickness of 250 µm.

Figure 4:
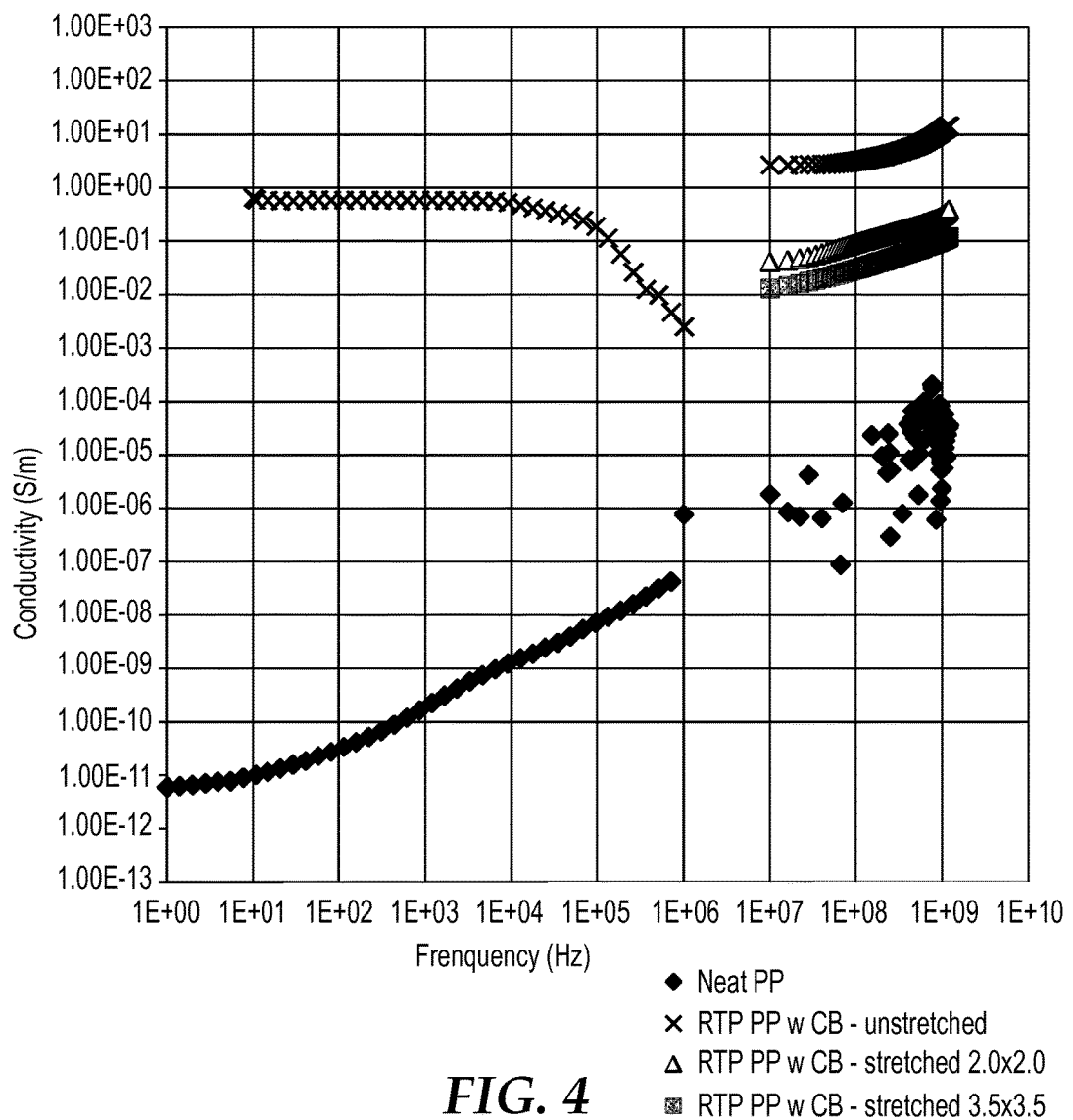
FIG. 4 is a graph showing conductivity as a function of frequency for various materials.

Pressed films were cut into 55×55 mm squares, gridded with permanent marker lines at 1 cm spacing and stretched in an Accupull Biaxial Film Stretcher (available from Inventure Laboratories Inc. Knoxville, Tenn.). Film samples were drawn over a range of simultaneous biaxial draw ratios (2×2, 3×3, 3.5×3.5, 4×4, 4.5×4.5, and 5×5) at a constant draw rate of 10%/s (based on initial jaw separation) with a 150° C. background temperature and 90 sec preheat time. Portions of pressed film and stretched film were cut into 50×50 mm squares, masked and sputtered coated with gold for 90 seconds. The AC conductance spectra of the samples were tested using the Test Methods listed above. Results for the out-of-plane conductivity are shown in FIG. 4. The in-plane conductivity for the stretched and unstretched RTP PP w/CB samples at 10 MHz was in the range of about 0.2 to about 0.6 S/m. In comparison, Neat PP had an in-plane conductivity of about $10^{-4}$ S/m at 10 MHz.

Low Loss-Factor Polypropylene Multi-Layer Extrusion

In order to show that a composite stack can be coextruded and that such as structure can give a low loss tangent, a composite stack containing various thermoplastic insulating layers was prepared from different grades of polypropylene. The stack was composed of three type A co-extruded multi-layers (corresponding to insulating layers 120 of FIG. 1). Each type A multi-layer included 7 sublayers of grade 1024 polypropylene (available from ExxonMobil, Irving, Tex., as PP1024E4). The type A multi-layers were separated with two type B co-extruded multi-layers (each type B multi-layer corresponding to nonconductive versions of conductive layers 150 of FIG. 1). Each type B multi-layer consisted of 22 sublayers of grade 3230 polypropylene (available from Total Petrochemicals, Houston, Tex.).

The multi-layer polypropylene stacks of this structure were prepared using a method of co-extrusion described in U.S. Pat. No. 6,767,492 (Norquist et al.). Grade 1024 polypropylene was extruded at 15 lb/hr (6.8 kg/hr) and grade 3230 polypropylene was extruded at 30 lb/hr (13.6 kg/hr). The stack total thickness was about 6 µm, thus every co-extruded PP layer was on average less than 100 nm thick.

Dielectric spectroscopy was performed on the resulting stacks as described under "Dielectric Spectroscopy". The dielectric losses remained low; the loss factor was around $10^{-3}$ in the frequency range 1-1,000 Hz, for applied voltage amplitudes in the range of 1 to 100 V.

Example 1: Multilayer Composite Stack with Engineered Effective Dielectric Function A multilayer polymer structure was designed with the goal of having a high-frequency Debye Relaxation resonant frequency, near 1 GHz, a large dielectric response on the low-frequency end, and an overall low loss tangent.

Figure 5A:
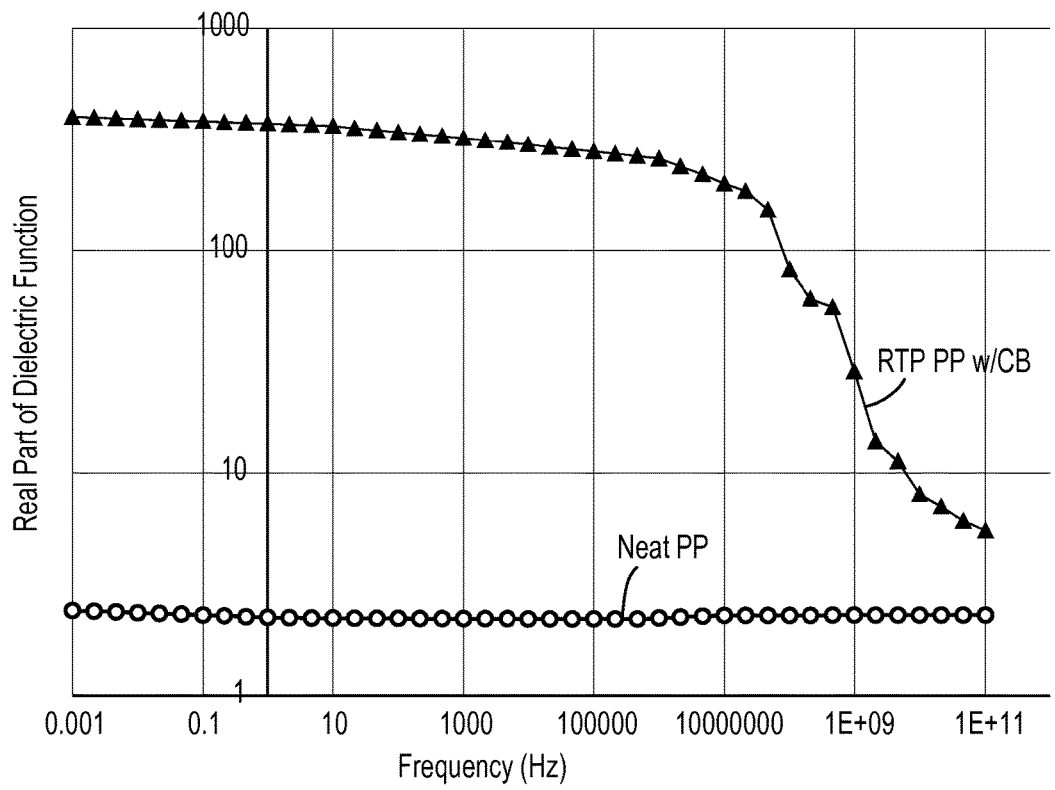
FIG. 5A is a graph showing the real part of the dielectric function as a function of frequency for neat polypropylene and for carbon black loaded polypropylene.
Figure 5B:
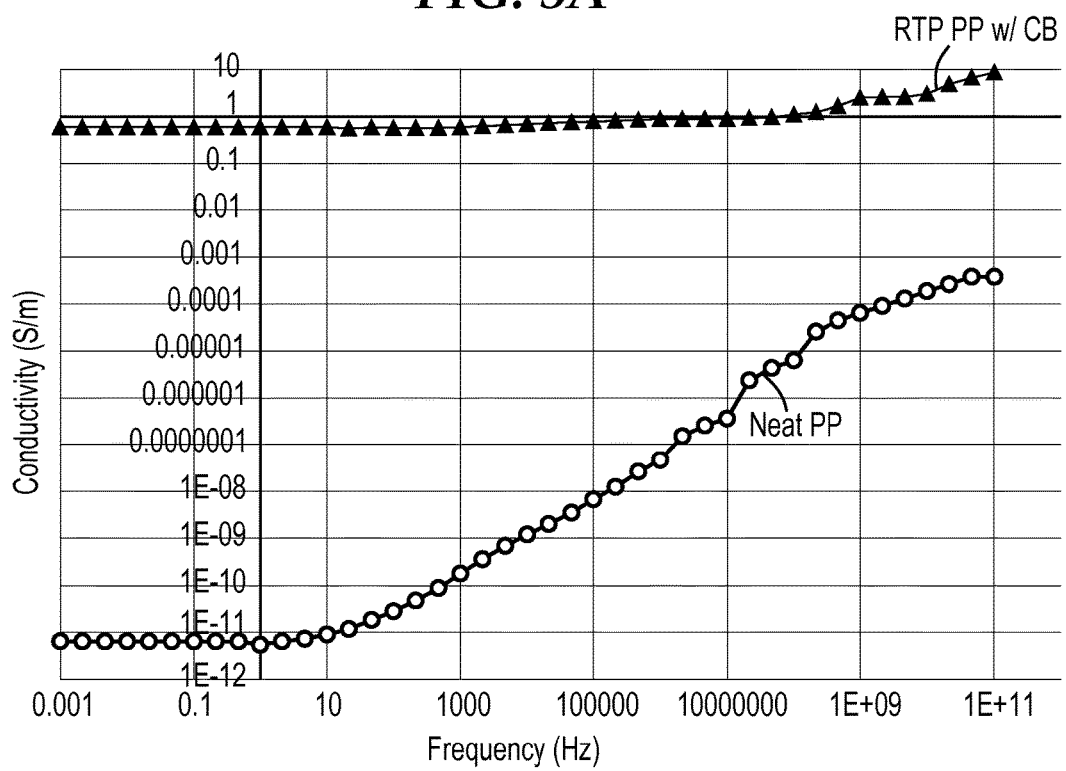
FIG. 5B is a graph showing the conductivity as a function of frequency for neat polypropylene and for carbon black loaded polypropylene.

The dielectric constant and absorption of a composite stack having insulating Neat PP layers and conductive RTP PP w/CB layers was determined by the constitutive properties of the materials used and by the layer thicknesses. For the purpose of modeling performance of composite stack, the conductance and dielectric function were determined as described in "Dielectric Spectroscopy" for non-stretched Neat PP and RTP PP w/ CB films. Smoothed curves were developed by averaging over results from several samples and extrapolating between low and high frequency data. The resulting constitutive properties, real part of dielectric constant $\in'$ and conductance $\sigma$ of Neat PP and of RTP PP w/CB are shown in FIGS. 5A-5B.

Figure 6A:
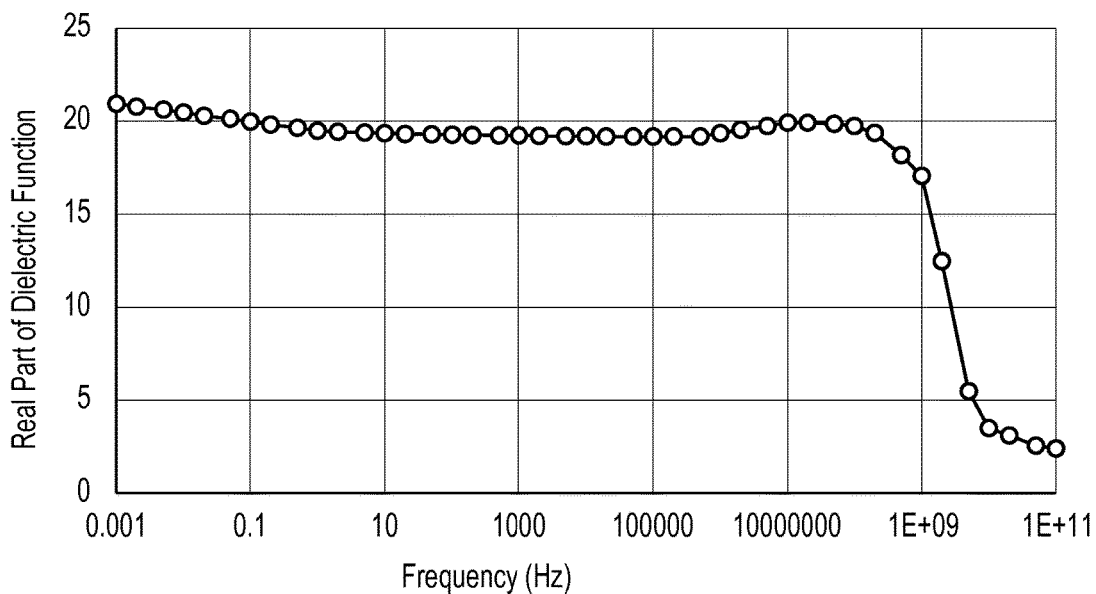
FIG. 6A is a graph showing the real part of the effective dielectric function for a composite stack as a function of frequency.
Figure 6B:
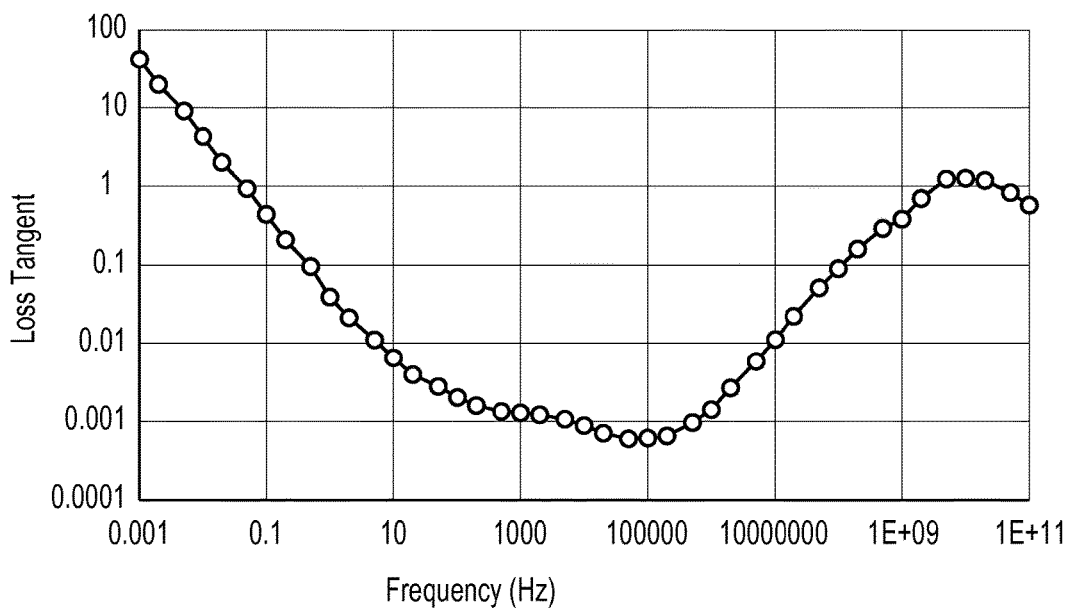
FIG. 6B is a graph showing the loss tangent for a composite stack as a function of frequency.

A capacitor having a composite stack that included Neat PP for the insulating layers (corresponding to insulator layer 120 of FIG. 1) and RTP PP w/CB for the conductive layers (corresponding to conducting layers 150 of FIG. 1) with a thickness ratio $T_C/(T_C+T_I)=0.9$ was modeled. The dielectric properties of the composite stack were determined using Equation (2). The results are shown in FIGS. 6A-6B. As shown in FIG. 6A, over the range spanning 0.001 Ha to above 1 MHz, the predicted effective dielectric constant of the stack exceeded 19. As shown in FIG. 6B, the loss tangent, which characterizes losses in the stack, remained below 0.01 over the frequency range spanning about 10 Hz to about 10 MHz and remained at or below about 0.001 over the frequency range from about 1000 Hz to about 1 MHz.

Example 2: Co-Extruded Multilayer Capacitor Structure with Alternating Conductive and Insulating Regions Thin multilayered composite stacks with polypropylene insulator regions sandwiched between conductive thermoplastic layers were prepared and characterized. The stack was composed of three type A co-extruded multi-layers (corresponding to insulating layers 120 in FIG. 1), each including 7 sublayers of grade 1024 polypropylene (available from ExxonMobil, Irving, Tex., as PP1024E4). The type A stacks were separated with two type B co-extruded conductive layers (corresponding to conductive layer 150 in FIG. 1). The conductive layers were prepared through extrusion of 80 parts by weight RTP PP w/CB and 20 parts by weight PRIEX 48101 (a maleic anhydride modified ionomeric PP random copolymer available from Addcomp Holland B.V.) blended together in a 2.5 in (1 cm) Davis-Standard single-screw extruder equipped with a standard compression screw with a Maddock mixing head, and fed through a gear pump and necktube to the feedblock. The final temperature for the extruder as well as the necktube and gear pump was 520° F. (271° C.).

The co-extruded structure included three thin insulating layers (corresponding to insulating layers 120 or FIG. 1) having thicknesses measuring respectively 14.5 µm, 11.4 µm and 13 µm at three positions for the first insulating layer (top most of the three insulating layers); 9.15 µm, 12.2 µm, and 8.38 µm at three positions for the second insulating layer (in the middle of the stack); and 11.4 µm, 8.42 µm and 8.42 µm at three positions for the third dielectric layer (lower most of the three). Four conductive layers (corresponding to conductive layers 150 of FIG. 1) were co-extruded with the insulating layers. These layers were immediately above the first insulating layer, immediately below the first insulating layer, immediately below the second insulating layer, and immediately below the third insulating layer, respectively. The conductive layer had thicknesses measuring respectively 28.2 µm, 29 µm and 28.2 µm at three positions for the first conductive layer (top most of the four conductive layers); 130 µm, 130 µm and 130 µm at three positions for the second conductive layer (next to the top most of the four conductive layers); 62.5 µm, 65.6 µm and 62.5 µm at three positions for the third conductive layer (next to the bottom most of the four conductive layers); and 6.90 µm, 6.90 µm and 6.10 µm at three positions for the fourth conductive layer (bottom most of the four conductive layers).

The co-extruded multilayer composite stack exhibited effective dielectric constant varying in the range of 9-13 over 1 Hz-10 kHz at DC voltage having peak-to-peak magnitudes at or below 100 V. The dissipation factor (effective loss tangent value) measured in these films varied in the range 0.02-0.4 over the range 1 Hz-10 kHz.

A capacitor including the composite stack can be prepared by applying electrodes to opposing surfaces of the composite stack. This can be done, for example, by metalizing the surfaces in a roll-to-roll sputtering process as described elsewhere.

The following is a list of exemplary embodiments of the present description.

Embodiment 1 is a capacitor, comprising:
  a first electrode, a second electrode and a composite stack disposed between the first electrode and the second electrode;
  wherein the composite stack comprises:
    one or more thermoplastic conductive layers;
    one or more thermoplastic insulating layers disposed adjacent the one or more thermoplastic conductive layers;
    and wherein the one or more thermoplastic conductive layers has a total thickness of $T_C$, the one or more thermoplastic insulating layers has a total thickness of $T_I$, and $T_C/T_I$ is greater than 3.

Embodiment 2 is the capacitor of embodiment 1, wherein the composite stack comprises two or more thermoplastic conductive layers and at least one thermoplastic insulating layer separates each thermoplastic conductive layer.

Embodiment 3 is the capacitor of embodiment 1, wherein at least one of the one or more thermoplastic insulating layers comprises a plurality of insulating sublayers.

Embodiment 4 is the capacitor of embodiment 3, wherein the plurality of insulating sublayers comprise an alternating stack of a first insulating thermoplastic polymer and a second insulating thermoplastic polymer different from the first insulating thermoplastic polymer.

Embodiment 5 is the capacitor of embodiment 1, wherein $T_C/T_I$ is greater than 5.

Embodiment 6 is the capacitor of embodiment 1, wherein each of the one or more thermoplastic conductive layers has an out-of-plane conductivity at a frequency of 60 Hz of greater than about $10^{-6}$ S/m.

Embodiment 7 is the capacitor of embodiment 1, wherein at least one of the one or more thermoplastic conductive layers comprise a thermoplastic polymer blended with a plurality of conductive particles at a concentration higher than a percolation threshold.

Embodiment 8 is the capacitor of embodiment 1, wherein the composite stack has an effective dielectric function having a real part greater than about 18 at a frequency of 60 Hz.

Embodiment 9 is the capacitor of embodiment 1, wherein the composite stack has an effective dielectric function having a resonance at a frequency greater than about 60 Hz.

Embodiment 10 is the capacitor of embodiment 9, wherein the resonance is at a frequency greater than about 1 MHz.

Embodiment 11 is the capacitor of embodiment 1, wherein the composite stack has an effective loss tangent less than 0.001 at a frequency between 1 Hz and 10 MHz.

Embodiment 12 is a capacitor, comprising:
  a first electrode, a second electrode and a composite stack disposed between the first electrode and the second electrode;
  wherein the composite stack comprises:
    two or more thermoplastic conductive layers;
    two or more thermoplastic insulating layers interspersed with the two or more thermoplastic conductive layers;
    wherein at least one of the two or more thermoplastic conductive layers comprises a thermoplastic polymer blended with a plurality of conductive particles at a concentration higher than a percolation threshold.

Embodiment 13 is the capacitor of embodiment 12, wherein the two or more thermoplastic conductive layers has a total thickness of $T_C$, the two or more thermoplastic insulating layers has a total thickness of $T_I$, and $T_C/T_I$ is greater than 3.

Embodiment 14 is the capacitor of embodiment 12, wherein at least one of the two or more thermoplastic insulating layers comprises a plurality of insulating sublayers.

Embodiment 15 is the capacitor of embodiment 12, wherein the composite stack has an effective dielectric function having a real part greater than about 20 at a frequency of 60 Hz.

Embodiment 16 is the capacitor of embodiment 12, wherein the composite stack has an effective dielectric function having a resonance at a frequency greater than about 60 Hz.

Embodiment 17 is the capacitor of embodiment 16, wherein the resonance is at a frequency greater than about 1 MHz.

Embodiment 18 is the capacitor of embodiment 12, wherein the composite stack has an effective loss tangent less than 0.001 at a frequency between 1 Hz and 10 MHz.

Embodiment 19 is a method of making a capacitor, comprising the steps of:
  providing at least one thermoplastic insulating material;
  providing at least one thermoplastic conductive material;
  co-extruding the at least one thermoplastic insulating material and the at least one thermoplastic conductive material to form a composite stack;
  stretching the composite stack;
  applying a first electrode to a first side of the composite stack; and,
  applying a second electrode to a second side of the composite stack opposite the first side of the composite stack;
  wherein the composite stack comprises:
    one or more conductive layers having a total thickness of $T_C$; and,
    one or more insulating layers having a total thickness of $T_I$;
    and wherein $T_C/T_I$ is greater than 3.

Embodiment 20 is the method of embodiment 19, wherein the at least one thermoplastic conductive material comprises a thermoplastic polymer blended with a plurality of conductive particles at a concentration higher than a percolation threshold.

Although specific embodiments have been illustrated and described herein, it will be appreciated by those of ordinary skill in the art that a variety of alternate implementations can be used for the specific embodiments shown and described without departing from the scope of the present disclosure. This application is intended to cover any adaptations or variations of the specific embodiments discussed herein.

What is claimed is:

1. A capacitor, comprising:
a first electrode, a second electrode and a composite stack disposed between the first electrode and the second electrode;
wherein the composite stack comprises:
one or more thermoplastic conductive layers, each thermoplastic conductive layer having an in-plane resistivity less than $10^{10}$ Ohm-cm and an out-of-plane resistivity less than $10^{10}$ Ohm-cm;
one or more thermoplastic insulating layers disposed adjacent the one or more thermoplastic conductive layers;
wherein the one or more thermoplastic conductive layers has a total thickness of $T_C$, the one or more thermoplastic insulating layers has a total thickness of $T_I$, and $T_C/T_I$ is greater than 3; and
wherein the composite stack satisfies at least one of the following conditions: (i) the composite stack has an effective dielectric function having a real part greater than about 18 at a frequency of 60 Hz; (ii) the effective dielectric function of the composite stack has a resonance at a frequency greater than about 60 Hz; or (iii) the composite stack has an effective loss tangent less than 0.001 at a frequency between 1 Hz and 10 MHz.

2. The capacitor of claim 1, wherein the composite stack comprises two or more thermoplastic conductive layers and at least one thermoplastic insulating layer separates each thermoplastic conductive layer.

3. The capacitor of claim 1, wherein at least one of the one or more thermoplastic insulating layers comprises a plurality of insulating sublayers.

4. The capacitor of claim 3, wherein the plurality of insulating sublayers comprise an alternating stack of a first insulating thermoplastic polymer and a second insulating thermoplastic polymer different from the first insulating thermoplastic polymer.

5. The capacitor of claim 1, wherein $T_C/T_I$ is greater than 5.

6. The capacitor of claim 1, wherein each of the one or more thermoplastic conductive layers has an out-of-plane conductivity at a frequency of 60 Hz of greater than about $10^{-6}$ S/m.

7. The capacitor of claim 1, wherein at least one of the one or more thermoplastic conductive layers comprise a thermoplastic polymer blended with a plurality of conductive particles at a concentration higher than a percolation threshold.

8. The capacitor of claim 1, wherein the real part of the effective dielectric function is greater than about 18 at a frequency of 60 Hz.

9. The capacitor of claim 1, wherein the resonance of the effective dielectric function is at a frequency greater than about 60 Hz.

10. The capacitor of claim 9, wherein the resonance is at a frequency greater than about 1 MHz.

11. The capacitor of claim 1, wherein the effective loss tangent is less than 0.001 at a frequency between 1 Hz and 10 MHz.

12. A capacitor, comprising:
a first electrode, a second electrode and a composite stack disposed between the first electrode and the second electrode;
wherein the composite stack comprises:
two or more thermoplastic conductive layers, each thermoplastic conductive layer having an in-plane resistivity less than $10^{10}$ Ohm-cm and an out-of-plane resistivity less than $10^{10}$ Ohm-cm;
two or more thermoplastic insulating layers interspersed with the two or more thermoplastic conductive layers;
wherein at least one of the two or more thermoplastic conductive layers comprises a thermoplastic polymer blended with a plurality of conductive particles at a concentration higher than a percolation threshold, the conductive particles having a conductivity greater than 1 S/cm.

13. The capacitor of claim 12, wherein the two or more thermoplastic conductive layers has a total thickness of $T_C$, the two or more thermoplastic insulating layers has a total thickness of $T_I$, and $T_C/T_I$ is greater than 3.

14. The capacitor of claim 12, wherein at least one of the two or more thermoplastic insulating layers comprises a plurality of insulating sublayers.

15. The capacitor of claim 12, wherein the composite stack has an effective dielectric function having a real part greater than about 20 at a frequency of 60 Hz.

16. The capacitor of claim 12, wherein the composite stack has an effective dielectric function having a resonance at a frequency greater than about 60 Hz.

17. The capacitor of claim 16, wherein the resonance is at a frequency greater than about 1 MHz.

18. The capacitor of claim 12, wherein the composite stack has an effective loss tangent less than 0.001 at a frequency between 1 Hz and 10 MHz.

19. A method of making a capacitor, comprising the steps of:
providing at least one thermoplastic insulating material;
providing at least one thermoplastic conductive material;
co-extruding the at least one thermoplastic insulating material and the at least one thermoplastic conductive material to form a composite stack;
stretching the composite stack;
applying a first electrode to a first side of the composite stack; and,
applying a second electrode to a second side of the composite stack opposite the first side of the composite stack;
wherein the composite stack comprises:
one or more conductive layers having a total thickness of $T_C$, each conductive layer having an in-plane resistivity less than $10^{10}$ Ohm-cm and an out-of-plane resistivity less than $10^{10}$ Ohm-cm; and
one or more insulating layers having a total thickness of $T_I$;
wherein $T_C/T_I$ is greater than 3; and
wherein the at least one thermoplastic conductive material comprises a thermoplastic polymer blended with a plurality of conductive particles at a concentration higher than a percolation threshold.

20. A capacitor, comprising:
a first electrode, a second electrode and a composite stack disposed between the first electrode and the second electrode;
wherein the composite stack comprises:
one or more thermoplastic conductive layers, each thermoplastic conductive layer having an in-plane resistivity less than $10^{10}$ Ohm-cm and an out-of-plane resistivity less than $10^{10}$ Ohm-cm;

one or more thermoplastic insulating layers disposed adjacent the one or more thermoplastic conductive layers;

wherein the one or more thermoplastic conductive layers has a total thickness of $T_C$, the one or more thermoplastic insulating layers has a total thickness of $T_I$, and $T_C/T_I$ is greater than 3; and wherein at least one of the one or more thermoplastic conductive layers comprise a thermoplastic polymer blended with a plurality of conductive particles at a concentration higher than a percolation threshold.

21. The capacitor of claim 20, wherein the composite stack comprises two or more thermoplastic conductive layers and at least one thermoplastic insulating layer separates each thermoplastic conductive layer.

22. The capacitor of claim 20, wherein at least one of the one or more thermoplastic insulating layers comprises a plurality of insulating sublayers.

23. The capacitor of claim 22, wherein the plurality of insulating sublayers comprise an alternating stack of a first insulating thermoplastic polymer and a second insulating thermoplastic polymer different from the first insulating thermoplastic polymer.

* * * * *